(12) United States Patent
Moon et al.

(10) Patent No.: US 11,152,582 B2
(45) Date of Patent: *Oct. 19, 2021

(54) LAMINATE AND MANUFACTURING METHOD THEREFOR

(71) Applicant: LG DISPLAY CO., LTD., Seoul (KR)

(72) Inventors: Young Kyun Moon, Daejeon (KR); Minsoo Kang, Daejeon (KR)

(73) Assignee: LG DISPLAY CO., LTD., Seoul (KR)

(*) Notice: Subject to any disclaimer, the term of this patent is extended or adjusted under 35 U.S.C. 154(b) by 548 days.

This patent is subject to a terminal disclaimer.

(21) Appl. No.: 14/909,381

(22) PCT Filed: Sep. 30, 2014

(86) PCT No.: PCT/KR2014/009242
§ 371 (c)(1),
(2) Date: Feb. 1, 2016

(87) PCT Pub. No.: WO2015/047057
PCT Pub. Date: Apr. 2, 2015

(65) Prior Publication Data
US 2016/0181559 A1    Jun. 23, 2016

(30) Foreign Application Priority Data

Sep. 30, 2013  (KR) .................. 10-2013-0116197

(51) Int. Cl.
*H01L 51/50*  (2006.01)
*H01L 51/52*  (2006.01)
(Continued)

(52) U.S. Cl.
CPC .............. *H01L 51/50* (2013.01); *B32B 15/04* (2013.01); *H01L 51/0017* (2013.01);
(Continued)

(58) Field of Classification Search
CPC . H01L 51/50; H01L 51/5212; H01L 51/5228; H01L 51/0017; H01L 51/0021;
(Continued)

(56) References Cited

U.S. PATENT DOCUMENTS 6,351,066 B1 * 2/2002 Gyoutoku ........... H01L 27/3283
313/503
7,923,313 B1 * 4/2011 Tutt .................. H01L 29/66787
257/57

(Continued)

FOREIGN PATENT DOCUMENTS

CN     101496192 A    7/2009
JP     2008108512 A   5/2008
(Continued)

*Primary Examiner* — Catherine A. Simone
(74) *Attorney, Agent, or Firm* — Dentons US LLP

(57) ABSTRACT

The present application relates to a laminate and a method for preparing the same. The present application provides a laminate, including: a substrate; a first layer provided on the substrate; a second layer which is provided on the first layer and has an overhang structure with a width which is larger than that of the first layer; a conductive layer which is provided on the substrate and the second layer, in which the conductive layer provided on the substrate is electrically shorted from the conductive layer provided on the second layer.

14 Claims, 2 Drawing Sheets

(51) Int. Cl.
  *H01L 51/00* (2006.01)
  *B32B 15/04* (2006.01)
(52) U.S. Cl.
  CPC ...... *H01L 51/0021* (2013.01); *H01L 51/5212* (2013.01); *H01L 51/5228* (2013.01); *Y10T 428/24488* (2015.01); *Y10T 428/24777* (2015.01)
(58) Field of Classification Search
  CPC ........ B32B 2307/302; B32B 2307/304; B32B 2307/206; B32B 2307/202; B32B 15/04; Y10T 428/24488; Y10T 428/24777
  See application file for complete search history.

(56) References Cited

U.S. PATENT DOCUMENTS

| | | | | |
|---|---|---|---|---|
| 8,004,188 | B2* | 8/2011 | Lifka | H01L 51/5228 313/509 |
| 9,847,502 | B2* | 12/2017 | Moon | H01L 51/5215 |
| 2005/0212415 | A1 | 9/2005 | Jung et al. | |
| 2006/0055313 | A1* | 3/2006 | Bae | H01L 27/3246 313/500 |
| 2007/0284595 | A1 | 12/2007 | Choi | |
| 2009/0321764 | A1 | 12/2009 | Lee et al. | |
| 2010/0084963 | A1 | 4/2010 | Lifka et al. | |
| 2012/0178247 | A1* | 7/2012 | Tutt | H01L 21/28114 438/479 |
| 2012/0223342 | A1 | 9/2012 | Tanada et al. | |
| 2013/0049578 | A1 | 2/2013 | Burroughes et al. | |
| 2013/0084692 | A1* | 4/2013 | Nelson | H01L 29/78642 438/479 |
| 2014/0240624 | A1 | 8/2014 | Misaki | |
| 2015/0001516 | A1* | 1/2015 | Yoshida | H01L 51/5231 257/40 |

FOREIGN PATENT DOCUMENTS

| | | | | |
|---|---|---|---|---|
| JP | 2012204250 A | 10/2012 | | |
| KR | 20110070170 A | 6/2011 | | |
| WO | 2013/051443 A1 | 4/2013 | | |
| WO | WO-2013099867 A1 * | 7/2013 | ......... | H01L 51/5231 |

* cited by examiner

[Figure 1]
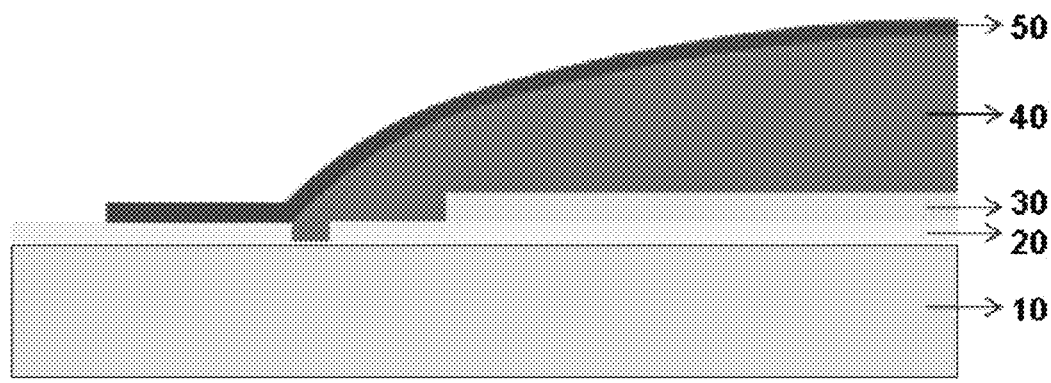
[Figure 2]
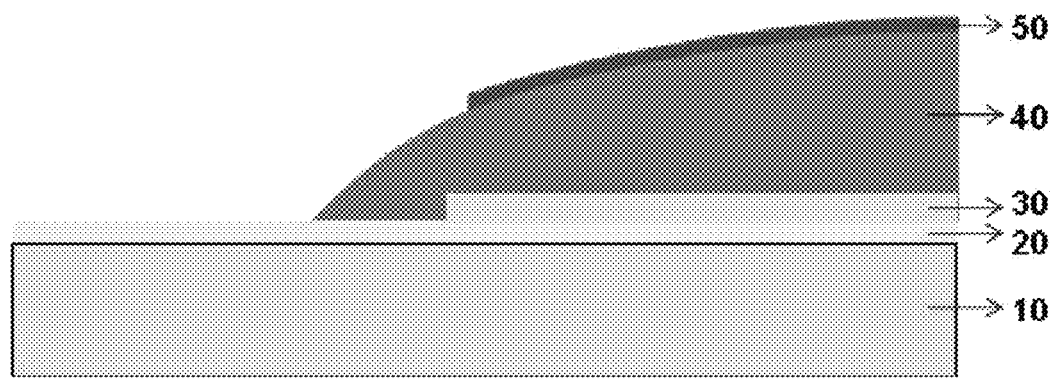
[Figure 3]
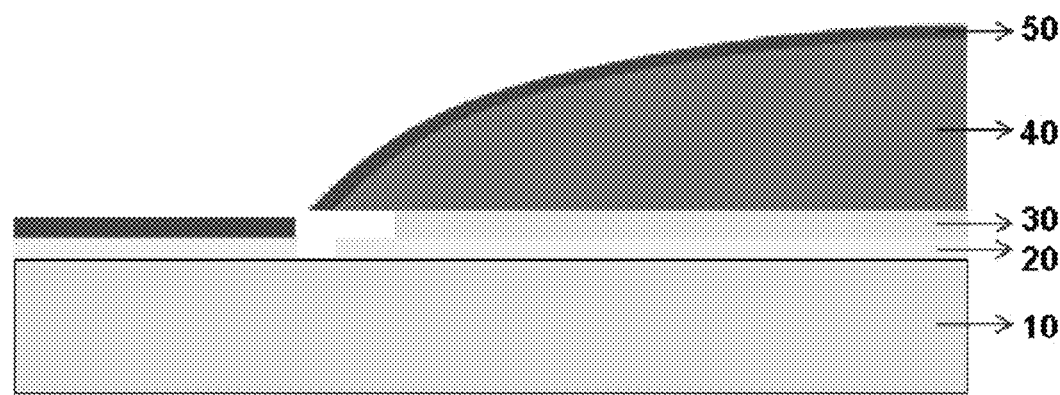

[Figure 4]
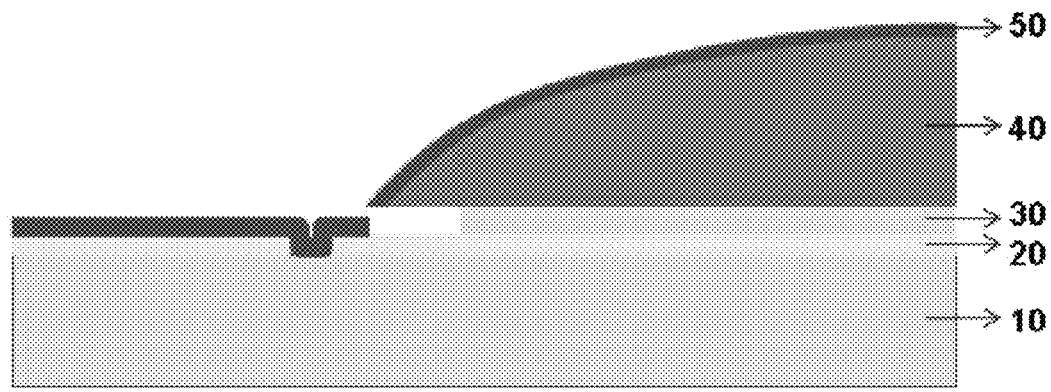
[Figure 5]
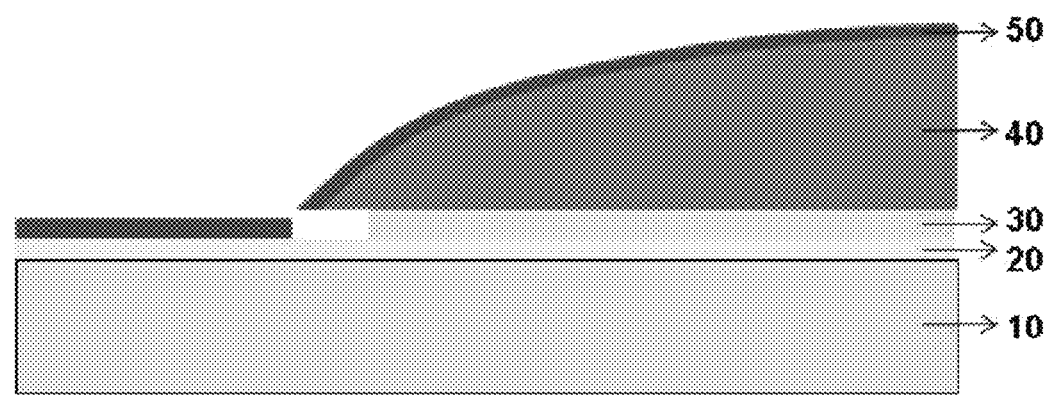
[Figure 6]
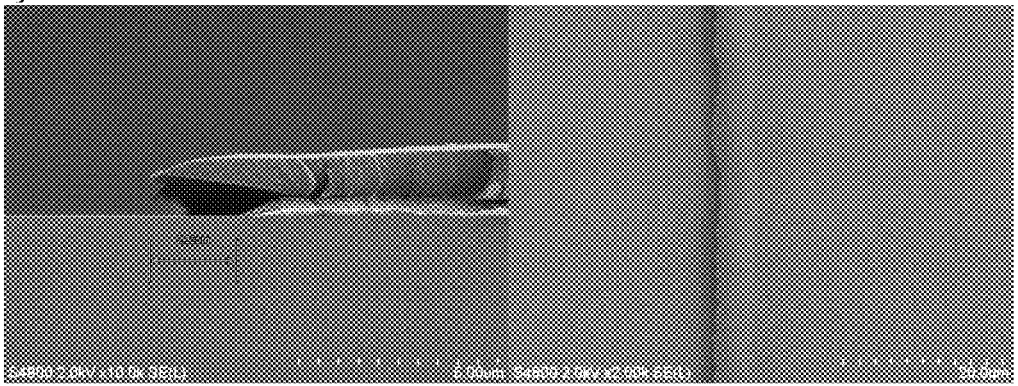

LAMINATE AND MANUFACTURING METHOD THEREFOR

This application is a National Stage Entry of International Application No. PCT/KR2014/009242, filed Sep. 30, 2014, and claims the benefit of Korean Application No. 10-2013-0116197, filed on Sep. 30, 2013, all of which are hereby incorporated by reference in their entirety for all purposes as if fully set forth herein.

TECHNICAL FIELD

This application claims priority to and the benefit of Korean Patent Application No. 10-2013-0116197 filed in the Korean Intellectual Property Office on Sep. 30, 2013, the entire contents of which are incorporated herein by reference.

The present application relates to a laminate and a method for preparing the same.

BACKGROUND ART

An organic light-emitting element is composed of two opposing electrodes and organic material thin films of a plurality of layers having semiconductor-like properties interposed therebetween. The organic light-emitting element having the configuration uses a phenomenon in which electric energy is converted into light energy by using an organic material, that is, an organic light emitting phenomenon. Specifically, when voltage is applied between two electrodes in a structure in which an organic layer is disposed between an anode electrode and an electrode, holes from the anode electrode and electrons from the cathode electrode are injected into the organic material layer. When the injected holes and electrons meet each other, an exciton is formed, and the exciton falls down to a bottom state to emit light.

In the aforementioned organic light-emitting element, light generated from the organic material layer is emitted through a light-transmitting electrode, and the organic light-emitting electrode may be typically classified into a top emission type, a bottom-emission type and a dual emission type. In the case of the top emission or bottom emission type, one of two electrodes needs to be a light transmissive electrode, and in the case of the double-sided emission type, all the two electrodes needs to be a light transmissive electrode.

In respect to the aforementioned organic light-emitting element, many studies have been concentrated since Kodak Co., Ltd. announced that when a multilayer structure is used, the element may be driving at a low voltage, and recently, a natural color display using the organic light-emitting element is attached to a mobile phone and commercialized.

Further, as recent studies on the organic light-emitting element using a phosphorescent material instead of an existing fluorescent material have been conducted, efficiency has been rapidly improved, and it is also expected that the element would be able to replace a known lighting in the near future.

In order to use the organic light-emitting element as lighting, the element needs to be driven at high brightness unlike the existing natural color display, and a constant brightness needs to be maintained like the existing lighting. In order to sufficiently improve the brightness of the organic light-emitting element, light emission needs to be implemented in a large area, and in order to implement light emission in the large area, a high driving current needs to be used. In addition, in order to maintain the constant brightness in the large area, the aforementioned high current needs to be uniformly injected into the diode having the large area.

DETAILED DESCRIPTION OF THE INVENTION

Technical Problem

A study on a conductive pattern which may be prepared by a simpler process and applicable to an organic light emitting element is required in the art.

Technical Solution

An exemplary embodiment of the present application provides a laminate, including: a substrate; a first layer provided on the substrate; a second layer which is provided on the first layer and has an overhang structure with a width which is larger than that of the first layer; and a conductive layer which is provided on the substrate and the second layer, in which the conductive layer provided on the substrate is electrically shorted from the conductive layer provided on the second layer.

Another exemplary embodiment of the present application provides a method for preparing a laminate, including: 1) forming a first layer on a substrate; 2) forming a second layer on the first layer, the second layer having an overhang structure whose width is larger than that of the first layer; and 3) forming conductive layers on the substrate and the second layer, the conductive layer provided on the substrate being electrically shorted from the conductive layer provided on the second layer.

Yet another exemplary embodiment of the present application provides an electrode including the laminate.

Advantageous Effects

The laminate according to the exemplary embodiment of the present application may be applied to an electrode for an organic light emitting element. Further, in the laminate according to the exemplary embodiment of the present application, electrically shorted conductive layers are formed on the substrate and the overhang structure so that usage of a mask for pattern formation which has been used in the related art during the manufacturing process of a laminate may be avoided. Accordingly, a cost for a manufacturing process of an organic light emitting element may be reduced.

BRIEF DESCRIPTION OF DRAWINGS

FIGS. 1 and 2 are views illustrating an electrode for an organic light emitting element of the related art.

FIGS. 3 to 5 are views illustrating an electrode for an organic light emitting element including a laminate according to an exemplary embodiment of the present application.

FIG. 6 is a view illustrating an electrophotography of an overhang structure according to the exemplary embodiment of the present application.

EXPLANATION OF REFERENCE NUMERALS AND SYMBOLS

10: Substrate
20: Anode electrode
30: Auxiliary electrode

40: 40: Insulating layer
50: Cathode electrode

BEST MODE

Hereinafter, the present application will be described in detail.

In general, an organic light-emitting diode for illumination has a structure in which a transparent electrode, an organic material layer, and a metal electrode are sequentially deposited on a substrate. When the organic light-emitting element is produced, deposition patterns of the organic material layer and the metal electrode have different areas on a plan view, and thus different masks are used during the deposition of the organic material layer and the metal electrode. Accordingly, there are problems in that it is necessary to replace the mask during the deposition process, productivity is not high due to a complex deposition equipment, and production costs are also high.

Therefore, the inventors study on a conductive pattern which may be prepared by a simpler process and applicable to an electrode of an organic light emitting element to complete the present invention.

A laminate according to an exemplary embodiment of the present application includes a substrate; a first layer which is provided on the substrate; a second layer which is provided on the first layer and has an overhang structure with a width which is larger than that of the first layer; and conductive layers which are provided on the substrate and the second layer, in which the conductive layer provided on the substrate is electrically shorted from the conductive layer provided on the second layer.

In this application, the conductive layer provided on the substrate may be electrically shorted from the first layer and the conductive layer provided on the substrate may be electrically shorted from the second layer.

That is, the first layer may be provided not on the entire surface of the substrate, but on a part of the substrate.

In this application, the electrically shorted structure means that two layers are physically separated from each other and structurally disposed to be spaced apart from each other.

In the related art, a mask for pattern formation is used to form a conductive layer having an electrically shorted structure, that is, a conductive pattern on a substrate. However, in the present application, conductive layers are formed on the substrate and a double layer having an overhang structure formed on the substrate so that a conductive pattern including a structure in which a conductive layer formed on the substrate and a conductive layer formed on the double layer having an overhang structure are electrically shorted from each other may be prepared, without using a separate mask for pattern formation.

In the present application, a second layer having an overhang structure whose width is larger than that of the first layer may be formed such that the first layer and the second layer include materials whose etching speeds by the same etchant are different from each other. That is, the second layer may include a material whose etching speed by the same etchant is lower than that of the first layer.

Further, the second layer having the overhang structure may be formed by varying a type of etchant which is used when the first layer and the second layer are formed.

Specific examples of the etchant may include hydrofluoric acid (HF), phosphoric acid ($H_3PO_4$), a buffered oxide etchant (BOE), a buffered HF solution (BHF), hydrogen peroxide-based etchants, $CH_3COOH$, HCl, $HNO_3$, or ferric-based etchants, but are not limited thereto.

Specifically, an optimized overhang structure may be formed by appropriately adjusting an etching time and a temperature when an etching process is performed on the first layer and the second layer. A photography of the overhang structure according to an exemplary embodiment of the present application is illustrated in FIG. 6.

In this application, the first layer may be a metal layer and the second layer may be an insulating layer.

The metal layer may include one or more of magnesium, calcium, sodium, potassium, titanium, indium, lithium, gadolinium, aluminum, silver, tin, lead, chrome, molybdenum, copper, and an alloy thereof, but is not limited thereto. A thickness of the metal layer may be from 50 nm to 5 µm, but is not limited thereto.

The insulating layer may be formed by using a material and a method known in the art. More specifically, the insulating layer may be formed by using a general photoresist material; polyimide; polyacryl; silicon nitride; silicon oxide; aluminum oxide; aluminum nitride; an alkali metal oxide; an alkaline earth metal oxide, and the like, but is not limited thereto. The thickness of the insulating layer may be from 10 nm to 10 µm, but is not limited thereto.

In the present application, a transparent conducting oxide layer may be additionally included between the substrate and the first layer. In this case, the transparent conducting oxide layer may be additionally included between the substrate and the conductive layer which is formed on the substrate.

The transparent conducting oxide may be at least one oxide selected from indium (In), tin (Sn), zinc (Zn), gallium (Ga), cerium (Ce), cadmium (Cd), magnesium (Mg), beryllium (Be), silver (Ag), molybdenum (Mo), vanadium (V), copper (Cu), iridium (Ir), rhodium (Rh), ruthenium (Ru), tungsten (W), cobalt (Co), nickel (Ni), manganese (Mn), aluminum (Al) and lanthanum (La).

In the present application, the conductive layer may include the transparent conducting oxide. The transparent conducting oxide may be at least one oxide selected from indium (In), tin (Sn), zinc (Zn), gallium (Ga), cerium (Ce), cadmium (Cd), magnesium (Mg), beryllium (Be), silver (Ag), molybdenum (Mo), vanadium (V), copper (Cu), iridium (Ir), rhodium (Rh), ruthenium (Ru), tungsten (W), cobalt (Co), nickel (Ni), manganese (Mn), aluminum (Al) and lanthanum (La).

Furthermore, the conductive layer may include one or more of magnesium, calcium, sodium, potassium, titanium, indium, yttrium, lithium, gadolinium, aluminum, silver, platinum, gold, tungsten, tantalum, copper, tin, lead, and an alloy thoseof.

The conductive layer may be formed by using any one physical vapor deposition selected from sputtering, E-beam evaporation, thermal evaporation, laser molecular beam epitaxy (L-MBE), and pulsed laser deposition (PLD); any one chemical vapor deposition selected from thermal chemical vapor deposition, plasma-enhanced chemical vapor deposition (PECVD), light chemical vapor deposition, laser chemical vapor deposition, metal-organic chemical vapor deposition (MOCVD) and hydride vapor phase epitaxy (HVPE); or atomic layer deposition (ALD).

The thickness of the conductive layer may be 50 nm to 5 µm, but is not limited thereto.

In the present application, the substrate may be formed of transparent plastic or glass, formed of the transparent conducting oxide mentioned above, or formed of one or more of magnesium, calcium, sodium, potassium, titanium, indium, yttrium, lithium, gadolinium, aluminum, silver, tin, lead, chrome, molybdenum, copper, and an alloy thoseof.

An exemplary embodiment of the present application provides a method for preparing a laminate, including: 1) forming a first layer on a substrate; 2) forming a second layer on the first layer, the second layer having an overhang structure whose width of the second layer is larger than that of the first layer; and 3) forming conductive layers on the substrate and the second layer, the conductive layer provided on the substrate being electrically shorted from the conductive layer provided on the second layer.

In the method for preparing the laminate, specific materials and forming methods of the substrate, the first layer, and the second layer are as same as those described above, so that specific description thereof will be omitted.

In the method for preparing the laminate, the overhang structure in step 2) may be formed by individually or simultaneously etching the first layer and the second layer.

In the present application, the method may further include forming a transparent conducting oxide layer between the substrate and the first layer.

Further, an electrode according to the exemplary embodiment of the present application may include the laminate.

Particularly, the electrode including the laminate may be applied to an organic light emitting element for a display and an organic light emitting element for illumination, but is not limited thereto. In this case, the conductive layer provided on the second layer may be applied as a cathode electrode and the substrate and the first layer may be applied as an anode electrode and an auxiliary electrode of the anode electrode, but are not limited thereto.

An electrode for the organic light emitting element of the related art is illustrated in FIGS. 1 and 2 and an electrode for an organic light emitting element including the laminate according to the exemplary embodiment of the present application is illustrated in FIGS. 3 to 5.

During a deposition process which is accompanied with the manufacturing of the organic light emitting element, a mask which is formed of metal is used as a shadow mask. More specifically, during a deposition process of an organic material, one or more shadow masks are used and during a deposition process of the second electrode, one shadow mask is used.

However, when the laminate according to an exemplary embodiment of the present application is prepared, the metal shadow mask is not necessary so that a manufacturing cost for a mask is reduced and a management cost for regularly washing and replacing the mask is reduced. Further, an organic material patterning technique is combined, so that a deposition process in which the mask is not necessary may be configured. Furthermore, when the mask is removed from deposition equipment, an equipment conveyance unit may be simplified. Specifically, as a size of equipment and a size of glass are increased, a cost reduction effect in accordance with the simplification as mentioned above is significantly increased.

As described above, the laminate according to the exemplary embodiment of the present application may be applied to an electrode for an organic light emitting element. Further, in the laminate according to the exemplary embodiment of the present application, an electrically shorted conductive layer is formed on the substrate and the overhang structure so that usage of a mask for pattern formation which has been used in the related art during the manufacturing process of a laminate may be avoided. Accordingly, a cost for a manufacturing process of an organic light emitting element may be reduced.

The invention claimed is:

1. A laminate, comprising:
a substrate;
a transparent conducting layer provided on the substrate;
a first layer provided on the transparent conducting layer;
a second layer which is provided on and in contact with the first layer and has an overhang structure with a width which is larger than that of the first layer; and
a conductive layer which is provided on the substrate and the second layer,
wherein the conductive layer provided on the substrate is electrically shorted from the conductive layer provided on the second layer,
wherein the conductive layer provided on the substrate and the conductive layer provided on the second layer are spaced apart from each other,
wherein the second layer and the transparent conducting layer are spaced apart,
wherein the transparent conducting layer is an anode electrode, the first layer is an auxiliary electrode of the anode electrode, and the conductive layer provided on the second layer is a cathode electrode,
wherein the second layer is an insulating layer, and
wherein the auxiliary electrode is connected with the anode electrode.

2. The laminate of claim 1, wherein the conductive layer provided on the substrate is electrically shorted from the first layer.

3. The laminate of claim 1, wherein the conductive layer provided on the substrate is electrically shorted from the second layer.

4. The laminate of claim 1, wherein the first layer and the second layer comprise materials whose etching speeds by the same etchant are different from each other.

5. The laminate of claim 1, wherein types of etchants which are used to form the first layer and the second layer are different from each other.

6. The laminate of claim 4, wherein the etchant comprises one or more selected from a group consisting of hydrofluoric acid (HF), phosphoric acid ($H_3PO_4$), a buffered oxide etchant (BOE), a buffered HF solution (BHF), hydrogen peroxide based etchants, $CH_3COOH$, HCl, $HNO_3$, and ferric based etchants.

7. The laminate of claim 1, wherein the first metal layer comprises one or more selected from a group consisting of magnesium, calcium, sodium, potassium, titanium, indium, lithium, gadolinium, aluminum, silver, tin, lead, chrome, molybdenum, copper, and an alloy thoseof.

8. The laminate of claim 1, wherein the insulating layer comprises one or more selected from a group consisting of a photoresist material; polyimide; polyacryl; silicon nitride; silicon oxide; aluminum oxide; aluminum nitride; an alkali metal oxide; and an alkaline earth metal oxide.

9. The laminate of claim 1, wherein the conductive layer comprises at least one oxide selected from indium (In), tin (Sn), zinc (Zn), gallium (Ga), cerium (Ce), cadmium (Cd), magnesium (Mg), beryllium (Be), silver (Ag), molybdenum (Mo), vanadium (V), copper (Cu), iridium (Ir), rhodium (Rh), ruthenium (Ru), tungsten (W), cobalt (Co), nickel (Ni), manganese (Mn), aluminum (Al) and lanthanum (La).

10. The laminate of claim 1, wherein the conductive layer comprises one or more selected from a group consisting of magnesium, calcium, sodium, potassium, titanium, indium, yttrium, lithium, gadolinium, aluminum, silver, platinum, gold, tungsten, tantalum, copper, tin, lead, and an alloy thoseof.

11. An electrode, comprising: a laminate of claim 1.

12. The laminate of claim 1, wherein the transparent conducting layer is provided between the substrate and the first layer, and between the substrate and the conducting layer provided on the substrate, and wherein the transparent conducting layer provided between the substrate and the first layer and the transparent conducting layer provided between the substrate and the conducting layer are space apart.

13. A laminate, comprising:

a substrate;

a transparent conducting layer provided on the substrate;

a first layer provided on the transparent conducting layer;

a second layer which is provided on and in contact with the first layer and has an overhang structure with a width which is larger than that of the first layer; and a conductive layer which is provided on the substrate and the second layer, wherein the conductive layer provided on the substrate is electrically shorted from the conductive layer provided on the second layer, wherein the first layer is in contact with the transparent conducting layer and the second layer, wherein the second layer and the transparent conducting layer are spaced apart by the first layer, wherein the transparent conducting layer is an anode electrode, the first layer is an auxiliary electrode of the anode electrode, and the conductive layer provided on the second layer is a cathode electrode, wherein the second layer is an insulating layer, and wherein the auxiliary electrode is connected with the anode electrode.

14. A method for preparing a laminate, comprising:

1) forming a transparent conducting layer on a substrate;

2) forming a first layer including a metal material on the transparent conducting layer, the first layer being connected with the transparent conducting layer;

3) forming a second layer on and in contact with the first layer, the second layer having an overhang structure whose width is larger than that of the first layer; and 4) forming conductive layers on the substrate and the second layer, the conductive layer provided on the substrate being electrically shorted from the conductive layer provided on the second layer, wherein the transparent conducting layer is an anode electrode, the first layer is an auxiliary electrode of the anode electrode, and the conductive layer provided on the second layer is a cathode electrode, wherein the overhang structure in step 3) is formed by simultaneously etching the first layer and the second layer, and wherein the second layer includes an insulating material whose etching speed by a same etchant is lower than that of the metal material of the first layer.

* * * * *